United States Patent [19]
Humphrey et al.

[11] Patent Number: 6,049,136
[45] Date of Patent: Apr. 11, 2000

[54] INTEGRATED CIRCUIT HAVING UNIQUE LEAD CONFIGURATION

[75] Inventors: Guy H. Humphrey; Rory L. Fisher, both of Ft. Collins; Jerry D'Amato, Loveland, all of Colo.

[73] Assignee: Hewlett-Packard Company, Palo Alto, Calif.

[21] Appl. No.: 09/089,684

[22] Filed: Jun. 3, 1998

[51] Int. Cl.[7] .............................. H01L 23/48; H01L 23/52
[52] U.S. Cl. ........................... 257/786; 257/692; 257/773
[58] Field of Search .................................. 257/202, 210, 257/211, 208, 773, 776, 786, 692, 778

[56] References Cited

U.S. PATENT DOCUMENTS

| | | |
|---|---|---|
| 4,939,592 | 7/1990 | Saika et al. . |
| 5,119,168 | 6/1992 | Misawa . |
| 5,420,800 | 5/1995 | Fukui ...................................... 364/491 |
| 5,475,236 | 12/1995 | Yoshizaki et al. . |
| 5,686,699 | 11/1997 | Chu et al. . |
| 5,723,908 | 3/1998 | Fichida et al. . |
| 5,751,557 | 5/1998 | Silva ...................................... 361/777 |
| 5,923,088 | 7/1999 | Shiue et al. . |

*Primary Examiner*—Sheila V. Clark

[57] ABSTRACT

The present invention is generally directed to a an integrated circuit package having a unique lead configuration, wherein the integrated circuit package is constructed from a die containing an integrated circuit. The die has a plurality of leads for carrying electrical signals to and from the integrated circuit, wherein the plurality of leads are disposed over a bottom side of the die. The package further includes a multi-layer substrate having at least two signal layers. The substrate is juxtaposed against the die and has a plurality of contacts disposed along a top side to align with the leads of the die to carry the electrical signals to conductive paths within the at least two signal layers. The multi-layer substrate has a larger adjoining surface area than the die and further has a plurality of leads disposed across a bottom side for connection with a printed circuit board, the on the bottom side being in communication with the leads of the top side by way of the conductive paths disposed within the substrate. The leads of the die are disposed such that at least two high speed rows of leads are disposed in parallel fashion near the center of the die, wherein the high speed rows are for carrying high frequency electrical signals. At least two sets of low speed rows of leads are disposed in parallel fashion near the sides of the die, and spaced apart from the high speed rows.

20 Claims, 6 Drawing Sheets

INTEGRATED CIRCUIT HAVING UNIQUE LEAD CONFIGURATION

BACKGROUND OF THE INVENTION

1. Field of the Invention

The present invention generally relates to integrated circuits, and more particularly to an integrated circuit package having a die with a unique lead configuration that allows a minimal number of signal layers to be used in the package substrate, and thereby realize a low cost integrated circuit package.

2. Discussion of the Related Art

As is known, there is a wide variety of computing devices that are designed from an even wider variety of integrated circuit devices. In years past, the primary concern among circuit designers was to design a circuit that achieved the appropriate and desired functionality for that circuit. While speed has always been one factor and concern in circuit design, the concerns in the past have primarily focused upon using faster and faster components and avoiding race conditions or other conflicts that may arise between different devices or integrated circuit packages.

Currently, however, clock and bus speeds have been driven to higher and higher levels (i.e., faster and faster speeds). This has raised new issues in circuit design. For example, previously the physical size of an integrated circuit package did not create design problems, except for the fact that generally smaller packages are desired to facilitate layout on a printed circuit board of a given size, improve power consumption, etc. In many contemporary systems, however, signal frequencies and transition speeds of electronic signals push the envelope with regard to the physical size of an integrated circuit chip. More specifically, fabrication technology (although ever-improving and allowing increasingly smaller integrated circuit packages) generally defines the size limit for a given integrated circuit package of a given transistor count. Within this given package size having a fixed latency, it has been found that there is a limit on the signal transition speed or frequency which can be handled by that package, without paying specific regard to the lead layout of the package.

To more specifically illustrate this concern, consider an integrated circuit chip of a ball grid array package type. As it is known, ball grid array circuit packages have a planer bottom face that is either square or rectangular in dimension. This face is generally covered with small spherical leads that carry electric signals to and from the integrated circuit that is a part of the chip or the integrated circuit package. As is known, the planar bottom forms part of a substrate (typically multi-layered substrate) to which an integrated circuit die is affixed. The signals on the substrate leads are communicated to and from the circuit die by way of smaller leads on the die.

Conventionally, these die leads have been disposed about the perimeter of the die. As a result, signals input on one lead and output on another lead often traveled entirely across the die. Although the die is relatively small in physical size, this size has nevertheless become a factor with regard to the higher signal frequencies of contemporary circuits. Therefore, without regard to the specific configuration or layout of these leads, a signal that passes through the chip may travel a distance that is roughly equal to the dimension of the chip (e.g., more specifically the height and width of the chip). Accordingly, this increases the latency of the chip, and since system design must be made from the "worst case" perspective, this lower latency is a limitation upon the speed that signals within the system may be driven.

Accordingly, it is desired to provide an improved lead configuration or layout for integrated circuit packages that results in lower latency times.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

To achieve the advantages and novel features, the present invention is generally directed to an integrated circuit package. In accordance with one aspect of the invention, the integrated circuit package includes a die containing an integrated circuit. The die has a plurality of leads for carrying electrical signals to and from the integrated circuit, wherein the plurality of leads are disposed over a bottom side of the die. The package further includes a multi-layer substrate having at least two signal layers. The package substrate is juxtaposed against the die and has a plurality of contacts disposed along a top side to align with the leads of the die to carry the electrical signals to conductive paths within the at least two signal layers. The multi-layer package substrate has a larger adjoining surface area than the die and further has a plurality of leads disposed across a bottom side for connection with a printed circuit board, the leads on the bottom side being in communication with the leads of the top side by way of the conductive paths disposed within the substrate.

In accordance with one aspect of the invention, the leads of the die are disposed such that at least two high speed rows of leads are disposed in parallel fashion near the center of the die, wherein the high speed rows are for carrying high frequency electrical signals. A first set of the at least two low speed rows of leads is disposed in parallel fashion near a first side of the die, and the two rows of low-speed leads are symmetrically disposed in parallel relation (but spaced apart) to the high speed rows. Similarly, a second set of at least two rows of leads are symmetrically disposed in parallel fashion near a second side of the die, and the at least to rows of leads are symmetrically disposed in parallel relation (but spaced apart as well) to the at least two high speed rows.

In accordance with the preferred embodiment of the present invention, an additional plurality of leads are provided on the die for carrying control signals, as well as power and ground signals. Preferably, the power and ground signal leads are dispersed near signal pads over the bottom surface of the die, whereas the control signals are grouped near one edge of the die.

In accordance with another aspect of the present invention, a die is provided for an integrated circuit package. In accordance with this aspect of the invention, the die includes a plurality of lead contacts disposed within a matrix area for electrical connection with pads on a substrate. More specifically, the die includes a first plurality of lead contacts disposed in a column form near the center of the matrix area and a second plurality of lead contacts disposed in a column form near the center of the matrix area parallel and spaced apart from the first plurality of lead contacts. The die further includes a third plurality of lead contacts disposed in at least two columns located near a first edge of the matrix and in parallel relationship with the first plurality of lead contacts, and a fourth plurality of lead contacts disposed in a least two columns located near a second edge of the matrix opposite the first edge and in a parallel relationship with the second plurality of lead contacts.

DESCRIPTION OF THE DRAWINGS

The accompanying drawings incorporated in and forming a part of the specification, illustrate several aspects of the present invention, and together with the description serve to explain the principles of the invention. In the drawings.

DETAILED DESCRIPTION OF THE PREFERRED EMBODIMENT

Figure 1:
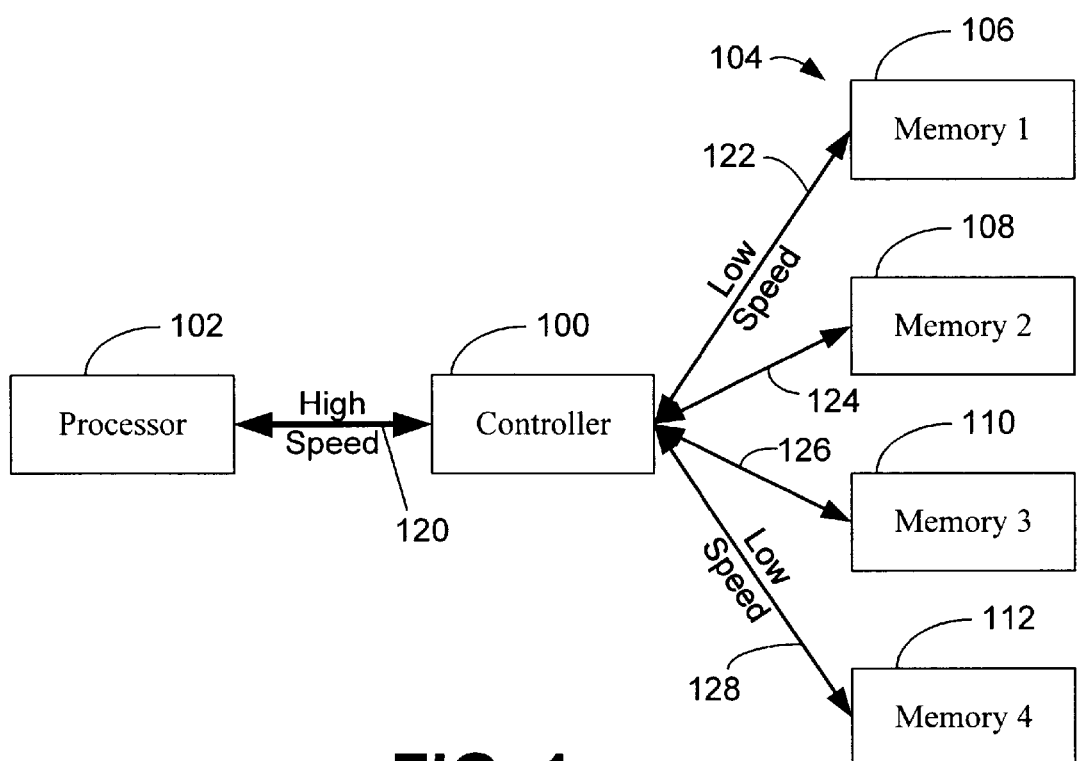
FIG. 1 is a block diagram illustrating the interposition of a controller constructed in accordance with the present invention, between a processor and bank of memory devices.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings, FIG. 1 shows a block diagram of a portion of a system utilizing a controller chip 100, constructed in accordance with the present invention. Although the concepts and teachings of the present invention may be readily extended to other types of circuit devices (functionally), the present invention was conceived in connection with a particular system design. In this regard, the present invention was conceived in connection with a controller circuit 100 that is disposed between a processor chip 102 and a bank of memories 104. In the system embodiment, the processor 102 drives a high speed data bus 120 to communicate with memory 104. Specifically, the high speed data bus 120 is source synchronous bus that includes nine data bits and two strobe bits, and has a data transfer rate of 250 MTs/sec. A source synchronous bus is a synchronous bus in that bus transfers are synchronized with other devices on the bus. However, rather than being synchronized with the other devices by way of a global clock, the source (i.e., component driving the bus) also drives one or more strobe signals that are synchronized (by the source) with the data placed on the bus, to capture the data on the receive side.

The controller circuit 100 is interposed between the processor 102 and bank of memories 104 and operates to divide sequential data transfers among a plurality of memory devices. In the preferred embodiment, four memory chips 106, 108, 110, and 112 are utilized. As will be appreciated, splitting (among memories 106, 108, 110, and 112) successive reads and writes between the processor 102 and memory 104 allows the bus speeds associated with each individual memory device to be slower. In the preferred embodiment, having four memory devices 106, 108, 110, and 112, allows the bus speed to each memory device to be one-fourth the speed of the high speed bus. Therefore, each bus 122, 124, 126, and 128 has a maximum data speed of 62.5 million transfers per second MTs/sec (or 125 MTs/sec, depending on the system configuration). As will be appreciated, this allows lower cost memory devices to be used in implementing the system.

It was found during the system design, however, that the data transfer rate on the high speed bus 120 presented latency problems for the controller chip 100.

Figure 2:
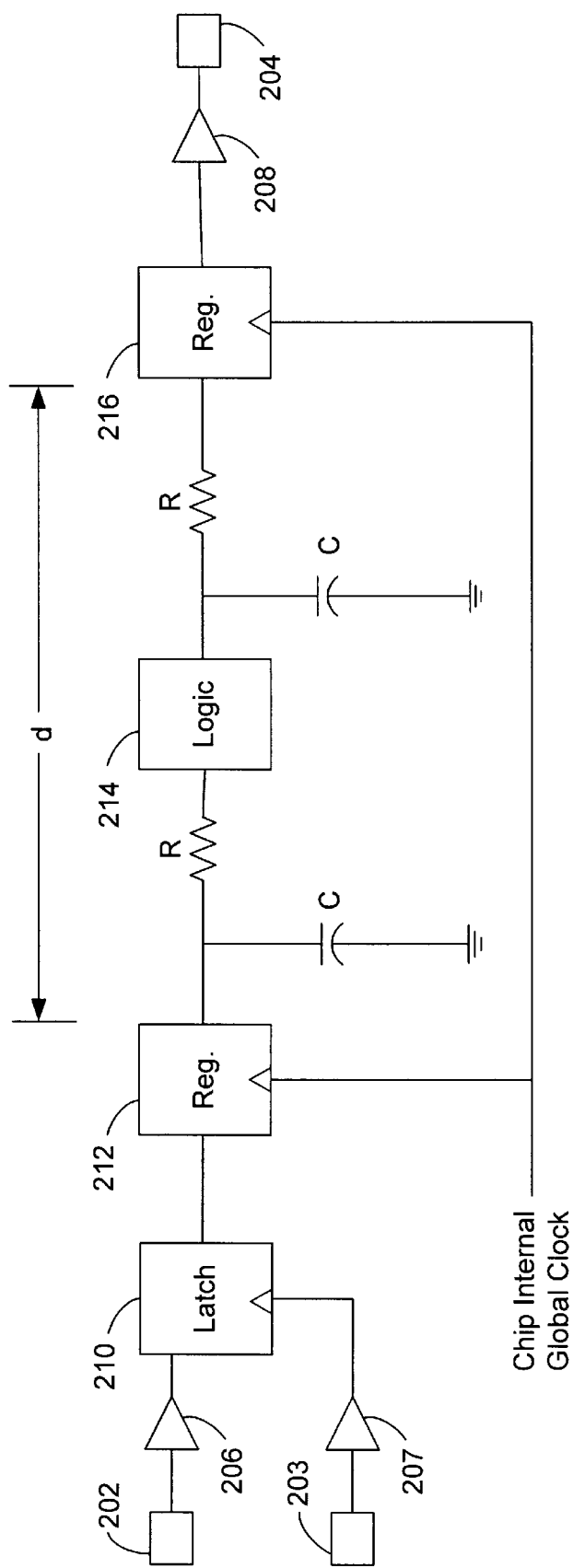
FIG. 2 is a schematic diagram illustrating the effect on latency of the physical distance of a conductive path within a die.

To better illustrate this latency problem, reference is briefly to FIG. 2. For simplicity, assume that a data signal from the high speed bus 120 enters the controller chip 100 at a lead 202. Typically a buffer or driver 206 is located near the lead 200 to drive the signal internally within the controller chip 100. Similarly, assume a strobe signal from the source synchronous bus 120 enters the controller 100 at lead 203. Likewise, this strobe signal is passed through a buffer or driver 207. The data signal is then latched into latch 210, using the strobe signal from the source synchronous bus. Registers 212 and 216 synchronize the data with the chip's internal clock.

Within the block 214 denoted as "logic", other operations may be performed by or upon the data signal. At some point, however, the data signal will be placed on a low speed data bus (e.g., 122). In this regard, the data signal exits the controller chip 100 via a lead 204. Immediately before exiting the controller chip 100, however, the data signal is driven by a buffer or driver 208.

While the logic 214, surrounded by the registers 212 and 216 generally defines the latency across the chip, the latency that is associated with the controller chip 100 is also determined in part by the number of components within the chip (e.g., 206, 208, 210, 212, 214, and 216) that the signal must pass through. However, it is also determined in part by the physical length "d" that the signal must traverse within the controller chip 100. As will be appreciated, this path can be modeled as an RC circuit. As the length "d" increases, the values of the R and the C increase as well. With an increasing RC value, rise times and fall times of signals within the controller chip 100 are increased. As is known, rise and fall times must generally be constrained within a predetermined amount, to satisfy specifications or for other reasons. Accordingly, as the length "d" of the internal signal path of controller chip 100 increases, the latency of the chip increases as well.

It is therefore a primary object of the present invention to design a controller chip 100 that reduces the worst case (i.e., the longest) signal path.

Figure 3:
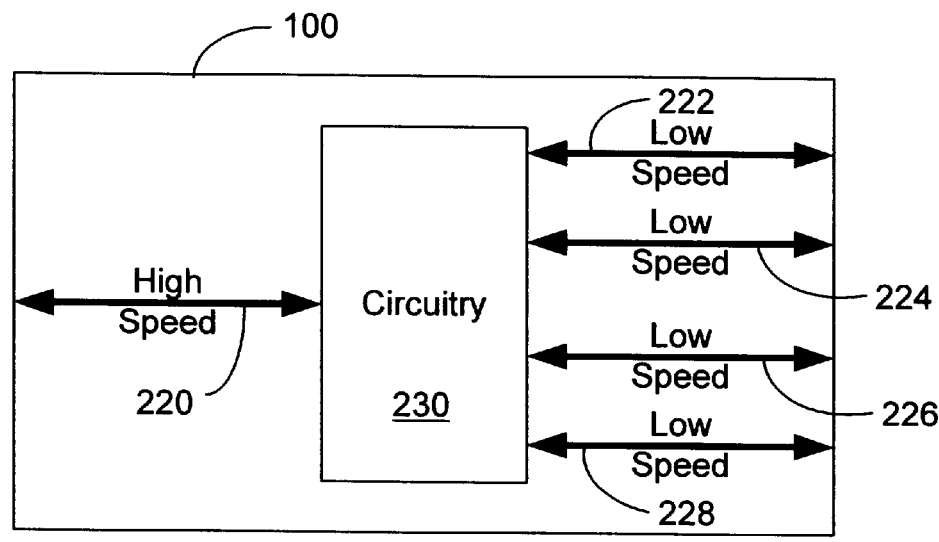
FIG. 3 is a block diagram of a controller chip of the present invention.

Reference is now made to FIG. 3, which is a block diagram illustrating the functional aspect of the controller chip 100 of the preferred embodiment of the present invention. In short, the controller chip 100 includes a high speed internal signal path 220 that communicates with the high-speed bus 120, and four signal paths 222, 224, 226, and 228 that communicate with the low-speed busses 122, 124, 126, and 128. A functional circuit block 230 is provided to perform the function of splitting up incoming data transfers over the high speed bus 220 into outgoing transfers over the low speed data busses 222, 224, 226, and 228. Conversely, the controller 100 also operates to receive incoming low speed transfers across busses 222, 224, 226, 228 and output them over the high speed bus 220. It will be appreciated that the functional circuitry needed to provide this operation will be understood and readily implementable by those of skill in the art, and therefore the details of the circuitry 230 need not be described herein.

Instead, the present invention is directed to a novel lead configuration of a die of an integrated circuit package that serves to minimize the worst case internal signal paths and therefore minimize the worst case signal latency associated with the controller 100. To better illustrate the advancement of the present invention, reference is first made to FIG. 4, which is a side view of an integrated circuit chip 400 as is known in the prior art. Central to all integrated circuit chips is an internal processing unit or die 402. The die 402 is positioned upon a package substrate 406, which may contain multiple signal layers. As used herein, unless specifically noted otherwise, the term "substrate" refers to the package substrate that underlies the die, and not to the substrate that the semiconductor die is grown upon.

Figure 4:
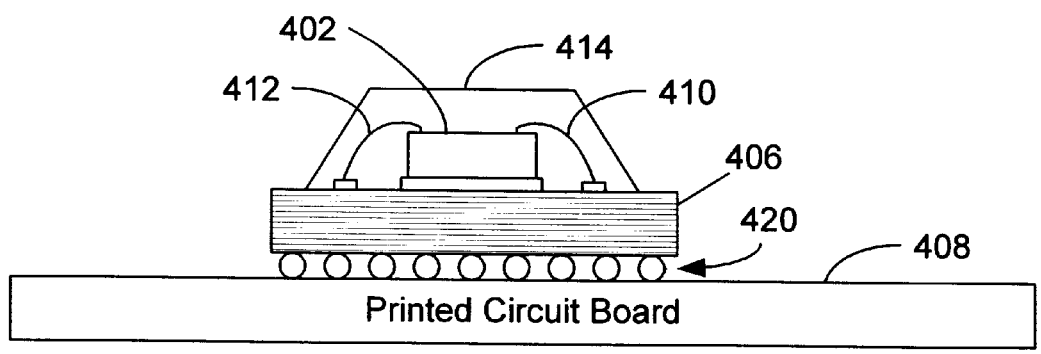
FIG. 4 is a side view of a conventional integrated circuit package as is known in the prior art.

Beneath the substrate 406 and opposite the die 402, are a plurality of leads 420, which serve to conduct signals to and from the integrated circuit device 400. The package of FIG. 4 is illustrated as being of a ball grid array (BGA) type circuit packet which has a matrix of spherically shaped leads 420. A printed circuit board 408 is also illustrated. As will be appreciated, a plurality of integrated circuit packages 400 may be disposed in various locations across the printed circuit board 408 and interconnected by conductive paths contained upon or within the printed circuit board 408. Hair-like bonding wires 410 and 412 serve to conduct signals from the die 402 to the substrate 406. The die 402 is encased against the substrate 406 by an over-mold compound 414.

As illustrated, in conventional circuit components, the bonding wires were connected about the perimeter of the die 402 and extended therefrom. As a result, the leads associated with the die 402 were generally disposed about the perimeter of the die 402. Consequently, the distance "d" (see FIG. 2) was often equal to the height and width of the die 402, since a signal may have to travel completely across the die from the point of entry to the point of exit.

Figure 5A:
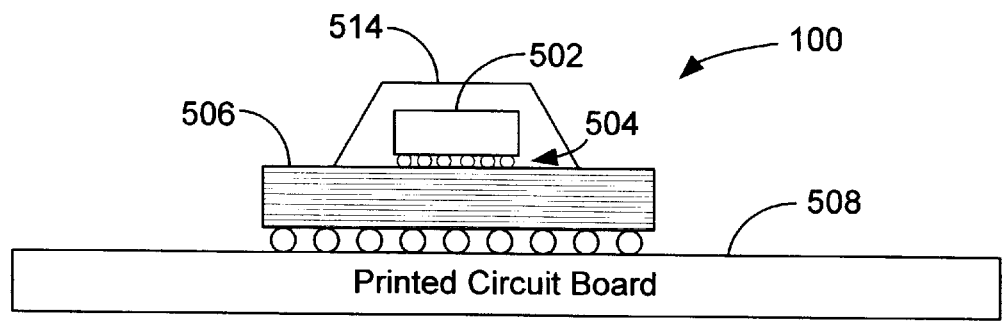
FIG. 5A is a side view of a flip chip type integrated circuit package.
Figure 5B:
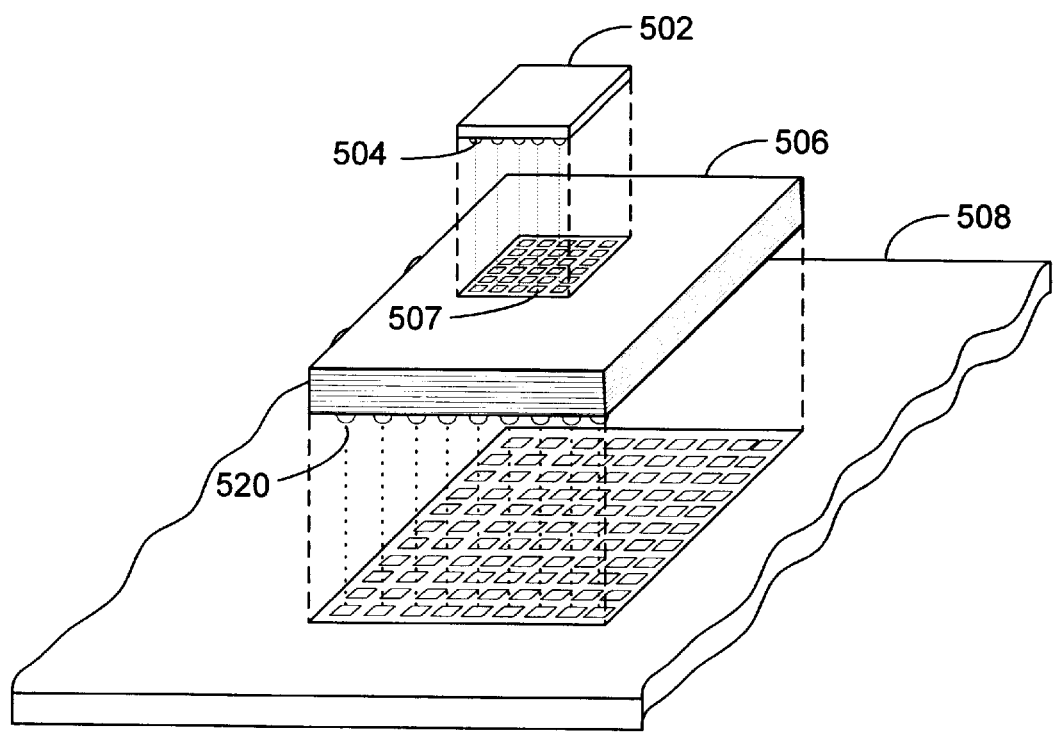
FIG. 5B is an exploded perspective view of the flip chip integrated circuit package of FIG. 5A.

Flip chip technology, however, changed this. In this regard, a flip chip type circuit component is illustrated in FIGS. 5A and 5B. Like the conventional package, a flip chip package includes a central die 502 disposed adjacent a substrate 506, which in turn is placed upon a circuit board 508. Again, the flip chip package may, like the conventional package, form a BGA type leads 520 which are soldered or otherwise bonded to the printed circuit board 508. Unlike the conventional chip, however, the flip chip includes a matrix of leads or contacts 504 that electrically connect the die 502 to the substrate 506. In this regard, as the name implies, the die 502 is flipped so that its circuit contacts can directly contact (without bonding wires) the substrate 506. As illustrated in the exploded-perspective view of FIG. 5B, the leads 504 are attached to, for example, solder pads 507. As shown, the leads are disposed in a matrix, across the entire surface area of the die 502. In this way, with some consideration and forethought given to the lead layout, the dimension "d" for the signal paths within the die 502 need not extend entirely across the physical dimension of the die 502.

Figure 6A:
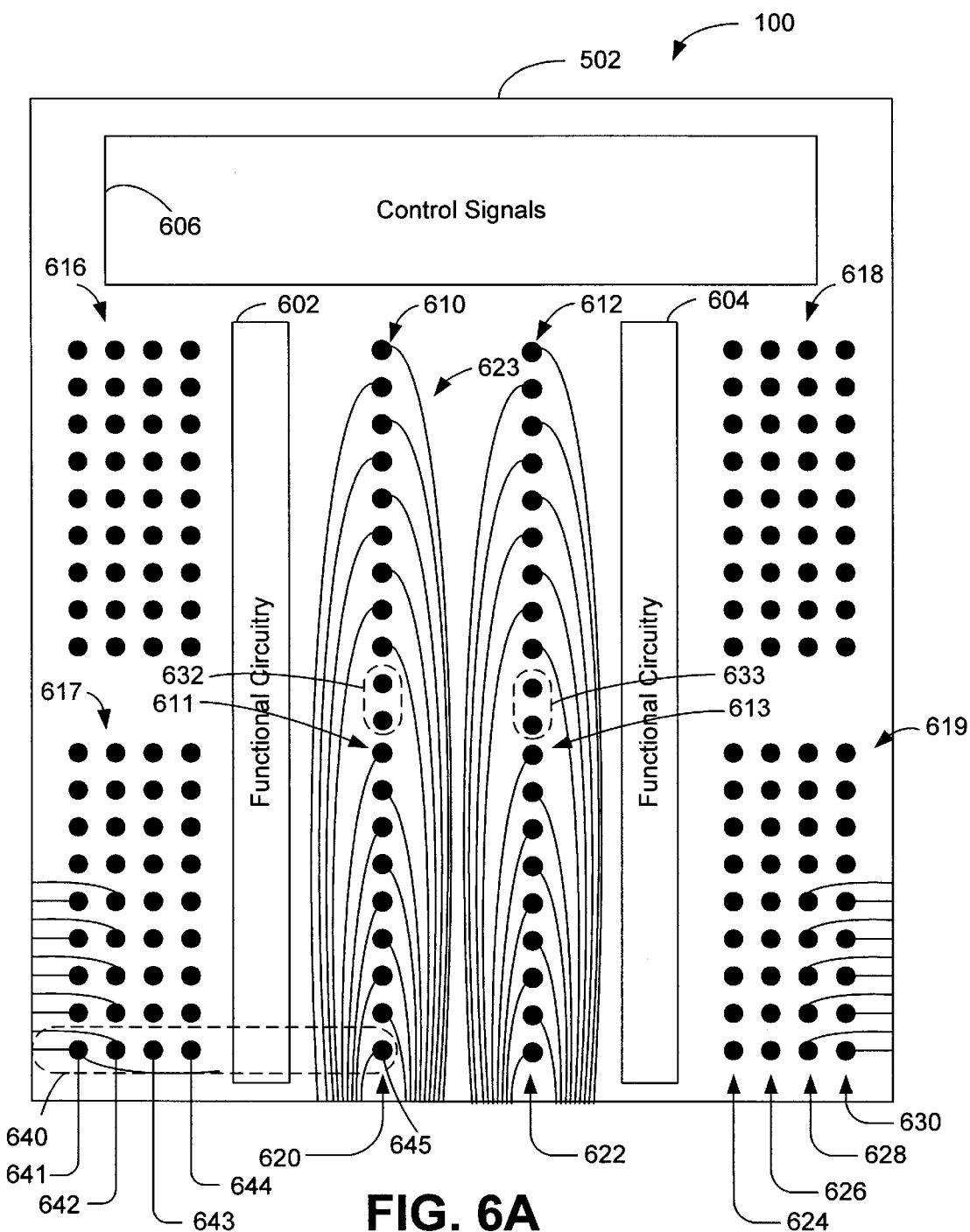
FIGS. 6A and 6B are diagrams illustrating the preferred lead configuration of a die constructed in accordance with the invention, and illustrate several conductive paths on a first and second signal layer, respectively.
Figure 6B:
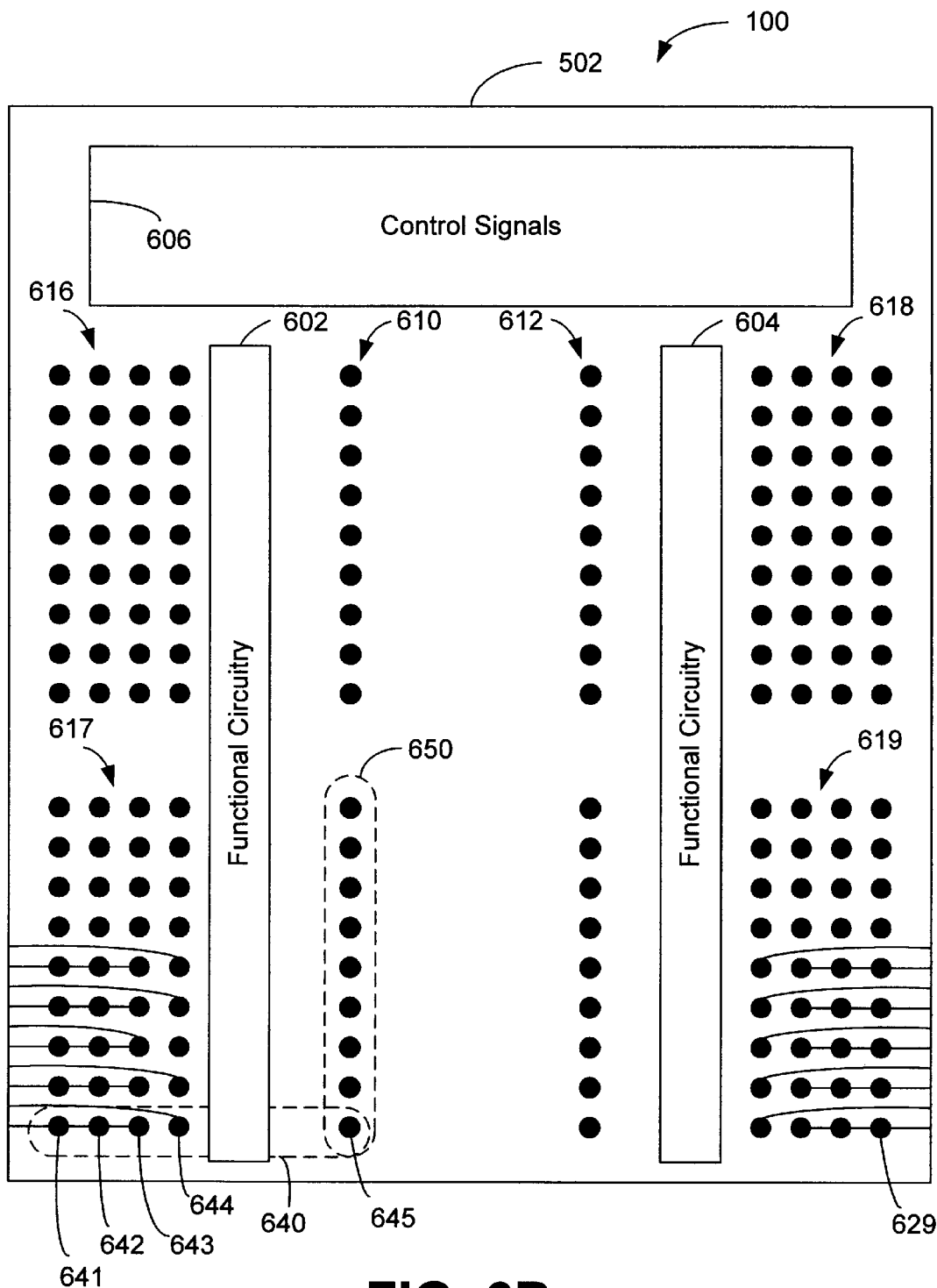

Reference is now made to FIGS. 6A and 6B which illustrate a preferred lead layout of a die 502 of a controller chip 100, constructed in accordance with the present invention. In accordance with the preferred embodiment of the present invention, the substrate 506 is a multi-layered substrate (see FIGS. 5A and 5B) having only two signal layers. In addition to the signal layers, power and ground layers are also provided, but do not form part of the present invention, and are therefore not discussed herein. As will be appreciated, as the number of substrate layers decreases, the cost associated with the overall integrated circuit package 100 decreases as well. Therefore, the lead layout of the present invention not only realizes a reduced latency associated with the chip, but also provides for a minimum number of substrate layers, and thereby a cost-effective circuit package. Accordingly, FIGS. 6A and 6B not only illustrate the lead layout of the preferred embodiment, but also illustrate the routing of conductive elements within the substrate 506. In this regard, FIG. 6A illustrates the routing of conductive paths in a first signal layer, and FIG. 6B illustrates the routing of certain conductive paths in a second signal layer.

As previously mentioned, the functional circuitry of the present invention will be implementable by those of skill in the art, without a detailed discussion of its operation herein. Accordingly, the functional circuitry of the chip 100 has been designated merely by blocks 602 and 604. Similarly, a block denoted as "Control Signals" 606 is also shown. Within this general area, there are a number of control signals, as well as power and ground signals transmitted between the die 502 and the substrate 506 (See FIGS. 5A and 5B). The particular layout of control signals is not deemed to form a part of the present invention, and therefore specific reference to control signals will not be discussed herein. Preferably the control signals are generally grouped in an area near one edge of the die 502.

Moreover, it will be appreciated that as the concepts and teachings of the present invention are expanded into other types of circuit components (other than the controller 100 of the preferred embodiment of the present invention), the number and types of control signals will differ. Accordingly, it is illustratively best to denote the control signals 606 in general terms herein. Likewise, it will be appreciated that it is generally desired to provide a relatively large number of power and ground leads so that power and ground signals may be somewhat uniformly distributed across the leads on the surface of the die 502. Like the control signals, the power and ground signals do not form part of the invention, and therefore are not specifically illustrated herein.

Having stated the foregoing general comments, reference is now made more particularly to FIG. 6A. In accordance with the preferred embodiment of the present invention, the controller 100 generally operates (functionally) to divide data received on the high speed transfer bus evenly among the four low speed data busses extending between the controller chip 100 and memory devices. Likewise, the chip 100 operates in the reverse fashion taking data input from the four low speed busses and outputting them over a single high speed bus. As also mentioned previously, the busses are preferably nine data bits wide.

In the controller chip 100 of the preferred embodiment, there are actually four high speed busses 610, 611, 612, and 613 that individually route to four groups of four low speed data busses 616, 617, 618, and 619 respectively. Recognizing the fact that a signal arriving to the die 502 on a low speed bus lead will not exit on another low speed bus lead, and similarly that signals arriving on a high speed bus lead will not exit on a high speed bus lead, the lead layout is designed accordingly. In this regard, the high speed data bus leads were disposed in two parallel columns 620 and 622 disposed near the center of the die 502, but spaced apart. Through the space separating the two columns 620 and 622 of high-speed bus signals, conductive paths could be disposed allowing the signals carried on the high speed data leads to be conducted away from the die 502. In fact, the space separating the two columns 620 and 622 and separating each of the columns 620 and 622 from the nearest low-speed bus column (e.g., column 622 and 624) is, preferably, just wide enough to route all of the high speed signals to the leads on the bottom side of the package substrate.

In this regard, and briefly referring again to FIGS. 5A and 5B, it will be appreciated that the conductive paths 523 illustrated in FIG. 6A are not actually carried on the die 502, but are actually routed on one of the signal layers of the substrate 506. In this regard, vias (not shown) align with the solder pads 507 (FIG. 5B) and penetrate directly into the substrate 506 to carry the signal on a given lead to either the first or second signal layers.

Likewise, four columns of leads 624, 626, 628, and 630 are disposed near each edge of the die 502 and in parallel relation to the columns 620 and 622 that carry the high speed data signals.

To illustrate the specific routing of conductive paths within the substrate 506, a dotted ellipse 640 is shown in both FIGS. 6A and 6B near the lower left hand corner of the drawing. This ellipse surrounds four leads associated with a given bit (for example, bit 0) of the four associated low-speed busses 641, 642, 643, and 644, and one lead 645 of the associated high-speed bus. More particularly, lead 645 is associated with a high speed bus that encompasses nine data bits identified by the dotted ellipse 650 (FIG. 6B). Assume, for illustration, that lead 645 is associated with bit 0 of that data bus. Likewise, leads 641, 642, 643, and 644 are associated with bit 0 for each of the four low speed busses associated with the high speed bus 650.

Within the die (not package substrate), a conductive path (not shown) may connect the lead 645 with the functional circuitry 602. The functional circuitry 602 must then be electrically connected to each of the leads 641, 642, 643, and 644, within the die. Assuming further, that the leads are disposed so closely together that only one signal path may extend between adjacent leads, the interconnections between the leads 641, 642, 643, and 644 may be carried out as illustrated in FIG. 6A (signal layer 1) and FIG. 6B (signal layer 2). Spacing the lead layout in this manner minimizes the physical size or footprint of the die. A similar signal path layout may also be provided for each of the other groups of die leads across the surface of the dye. As should be appreciated, the "worst case" signal path is one wherein the lead 645 is connected to the lead 630, which is a distance of approximately two-thirds the width of the chip.

The specific signal path routing, however, is not deemed to form a part of the present invention. Rather, the present invention is concerned with the general layout of the leads that reduces the length of signal routing, and thereby minimizes the latency associated with the chip. In this regard, grouping the high speed busses in the manner shown and closely grouping the leads of the associated low speed data busses as shown reveals that a signal path will not, in any instance, extend all the way across the width of the die 502.

Leads 632 and 633 may also be provided in the general location illustrated for carrying the source driven strobe signals. Also, power and ground leads (not shown) are preferably dispersed across the bottom surface of the die and are preferably disposed near the signal pads.

The foregoing description has been presented for purposes of illustration and description. It is not intended to be exhaustive or to limit the invention to the precise forms disclosed. Obvious modifications or variations are possible in light of the above teachings. The embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. An integrated circuit package having a unique lead configuration comprising:

a die containing an integrated circuit, the die having a plurality of leads for carrying electrical signals to and from the integrated circuit, the plurality of leads being disposed over a bottom side of the die;

a multi-layer substrate having at least two signal layers, the substrate being juxtaposed against the die and having a plurality of contacts disposed along a top side to align with the leads of the die to carry the electrical signals to conductive paths within the at least two signal layers, the multi-layer substrate having a larger adjoining surface area than the die and having a plurality of leads disposed across a bottom side of the multi-layer substrate for connection with a printed circuit board, the leads on the bottom side of the die being in communication with the contacts of the top side of the multi-layer substrate by way of the conductive paths;

wherein the leads of the die are disposed in the following configuration:

at least two high speed rows are disposed in parallel fashion near the center of the die, the high speed rows are for carrying high frequency electrical signals;

a first set of at least two low speed rows of leads disposed in parallel fashion near a first side of the die, the at least to rows of leads being symmetrically disposed in parallel relation to the at least two high speed rows and spaced apart therefrom; and a second set of at least two rows of leads disposed in parallel fashion near a second side of the die, the at least to rows of leads being symmetrically disposed in parallel relation to the at least two high speed rows and spaced apart therefrom.

2. The integrated circuit package as defined in claim 1 further including a plurality of sections of leads disposed near a top edge of the die for carrying control signals.

3. The integrated circuit package as defined in claim 2 wherein a majority of the conductive paths of the substrate that are electrically connected to the leads of the high speed rows extend in a substantially parallel fashion to the high speed rows.

4. The integrated circuit package as defined in claim 3 wherein a majority of the conductive paths of the substrate that are electrically connected to the leads of the low speed rows extend in a substantially perpendicular fashion to the low speed rows.

5. The integrated circuit package as defined in claim 1 further includi ng a row of leads disposed adjacent one of the high speed rows for carrying power signals.

6. The integrated circuit package as defined in claim 1 further including a row of leads disposed adjacent one of the high speed rows for carrying ground signals.

7. The integrated circuit package as defined in claim 5 further including a row of leads disposed adjacent one of the high speed rows for carrying ground signals.

8. The integrated circuit package as defined in claim 1 wherein a majority of the conductive paths of the substrate that are electrically connected to the leads of the high speed rows extend in a substantially parallel fashion to the high speed rows.

9. The integrated circuit package as defined in claim 1 wherein a majority of the conductive paths of the substrate that are electrically connected to the leads of the low speed rows extend in a substantially perpendicular fashion to the low speed rows.

10. The integrated circuit package as defined in claim 8 wherein a majority of the conductive paths of the substrate that are electrically connected to the leads of the low speed rows extend in a substantially perpendicular fashion to the low speed rows.

11. The integrated circuit package as defined in claim 1, wherein the integrated circuit package is constructed in accordance with flip-chip technology.

12. A die for an integrated circuit package having a plurality of lead contacts disposed within an area for electrical connection with pads on a substrate comprising:

a first plurality of lead contacts disposed in a single column near the center of the area;

a second plurality of lead contacts disposed in a single column near the center of the area parallel and spaced apart from the first plurality of lead contacts, wherein the first plurality of lead contacts and the second plurality of lead contacts are separated by a first space;

a third plurality of lead contacts disposed in at least two columns located near a first edge of the area and in parallel relationship with the first plurality of lead contacts, the third plurality of lead contacts being disposed on a side of the first plurality of contacts opposite the second plurality of contacts, the third plurality of lead contacts being separated from the first plurality of lead contacts by a second space, wherein the second space is larger than the first space; and a fourth plurality of lead contacts disposed in a least two columns located near a second edge of the area opposite the first edge and in a parallel relationship with the second plurality of lead contacts, the fourth plurality of lead contacts being disposed on a side of the second plurality of contacts opposite the first plurality of contacts, the fourth plurality of lead contacts being separated from the second plurality of lead contacts by a third space, wherein the third space is larger than the first space.

13. The substrate for an integrated circuit package as defined in claim 12, further including a plurality of lead contacts disposed near a top edge of the matrix.

14. The substrate for an integrated circuit package as defined in claim 12, wherein the first and second plurality of lead contacts are disposed to carry high frequency signals.

15. The substrate for an integrated circuit package as defined in claim 14, wherein the third and fourth plurality of lead contacts are disposed to carry lower frequency signals.

16. The substrate for an integrated circuit package as defined in claim 15, further including a fifth plurality of lead contacts disposed in a column form adjacent the first plurality of lead contacts, the fifth plurality of lead contacts for carrying power signals.

17. The substrate for an integrated circuit package as defined in claim 15, further including a sixth plurality of lead contacts disposed in a column form adjacent the second plurality of lead contacts, the sixth plurality of lead contacts for carrying ground signals.

18. A die for an integrated circuit package having a plurality of lead contacts disposed within an area for electrical connection with pads on a substrate comprising:

a first plurality of lead contacts disposed in a column form near the center of the area;

a second plurality of lead contacts disposed in a column form near the center of the area parallel and spaced apart from the first plurality of lead contacts, wherein the first and second plurality of lead contacts are disposed to carry high frequency signals;

a third plurality of lead contacts disposed in at least two columns located near a first edge of the area and in parallel relationship with the first plurality of lead contacts; and a fourth plurality of lead contacts disposed in a least two columns located near a second edge of the area opposite the first edge and in a parallel relationship with the second plurality of lead contacts.

19. The substrate for an integrated circuit package as defined in claim 18, wherein the third and fourth plurality of lead contacts are disposed to carry lower frequency signals.

20. The substrate for an integrated circuit package as defined in claim 19, further including a fifth plurality of lead contacts disposed in a column form adjacent the first plurality of lead contacts, the fifth plurality of lead contacts for carrying power signals.

* * * * *